United States Patent
Wen et al.

(10) Patent No.: US 8,692,235 B2
(45) Date of Patent: Apr. 8, 2014

(54) ORGANIC PHOTOELECTRIC SEMICONDUCTOR DEVICE AND METHOD FOR FABRICATING THE SAME

(75) Inventors: Ten-Chin Wen, Tainan (TW); Sung-Nien Hsieh, Zhutian Township, Pingtung County (TW); Tzung-Fang Guo, Minxiong Township, Chiayi County (TW); Wei-Chou Hsu, Tainan (TW); Chen-Yan Li, Taichung (TW)

(73) Assignee: National Cheng Kung University, Tainan (TW)

( * ) Notice: Subject to any disclaimer, the term of this patent is extended or adjusted under 35 U.S.C. 154(b) by 451 days.

(21) Appl. No.: 13/051,126

(22) Filed: Mar. 18, 2011

(65) Prior Publication Data
US 2011/0227047 A1 Sep. 22, 2011

(30) Foreign Application Priority Data
Mar. 22, 2010 (TW) .............................. 99108379 A

(51) Int. Cl.
*H01L 51/30* (2006.01)

(52) U.S. Cl.
USPC ........... 257/40; 257/E51.024; 438/82; 438/99

(58) Field of Classification Search
USPC ......... 257/40, E51.012–E51.022; 438/22–47, 438/57–99
See application file for complete search history.

(56) References Cited

U.S. PATENT DOCUMENTS 5,677,572 A 10/1997 Hung et al.
5,998,803 A * 12/1999 Forrest et al. .................. 257/40

(Continued)

FOREIGN PATENT DOCUMENTS

JP S5589500 A 7/1980
JP 2007-154300 A 6/2007

OTHER PUBLICATIONS

Hongbin Wu, Fei Huang, Yueqi Mo, Wei Yang, Deli Wang, Junbiao Peng, and Yong Cao; Efficient Electron Injection from a Bilayer Cathode Consisting of Aluminum and Alcohol-/Water-Soluble Conjugated Polymers; Advanced Materials; Oct. 18, 2004; p. 1826-p. 1830; vol. 16, No. 20; WILEY-VCH Verlag GmbH & Co. KgaA, Weiheim.

(Continued)

*Primary Examiner* — Julio J Maldonado
*Assistant Examiner* — Daniel Shook
(74) *Attorney, Agent, or Firm* — Bacon & Thomas, PLLC

(57) ABSTRACT

An organic photoelectric semiconductor device including organic group VA salts in an organic salt-containing layer and a method for manufacturing the same are provided. The organic photoelectric semiconductor device includes: a first electrode; an organic active layer disposed over the first electrode; an organic salt-containing layer disposed over the organic active layer, where the organic salt-containing layer includes quaternary group VA salts of cations represented by the following formula (I) or derivatives thereof and anions; and a second electrode, disposed over the organic salt-containing layer,

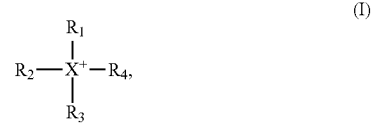

where, X, $R_1$, $R_2$, $R_3$ and $R_4$ are defined the same as the specification. Accordingly, the present invention can enhance the transmission of electrons and thus enhances the performance of devices.

20 Claims, 10 Drawing Sheets

(56) References Cited

U.S. PATENT DOCUMENTS

| | | |
|---|---|---|
| 6,404,126 B1 | 6/2002 | Arai et al. |
| 6,563,262 B1 | 5/2003 | Cao |
| 6,946,319 B2 | 9/2005 | Stegamat et al. |
| 7,033,680 B2 * | 4/2006 | Tanaka et al. ............... 428/690 |

OTHER PUBLICATIONS

Bo Jiao, Zhaoxin Wu, Yang Dai, Dongdong Wang and Xunhou, Sodium borohydride as an n-type dopant in tris(8-hydroxyquinoline) aluminium thin film, Journal of Physics D: Applied Physics, Oct. 2, 2009, p. 1-4, 42, IOP Publishing, United Kingdom.

Shih-Pin Chen, Inverted polymer light-emitting devices with interfacial modification of cathode using different nanolayers, Department of Chemical Engineering National Cheng Kung University, Thesis for Master Degree of Engineering, Jun. 2009, Taiwan.

Hua-Hsien Liao, Li-Min Chen, Zheng Xu, Gang Li, and Yang Yang, Highly efficient inverted polymer solar cell by low temperature annealing of Cs2CO3 interlayer, Applied Physics Letters, Apr. 30, 2008, 92, 173303.

* cited by examiner

ORGANIC PHOTOELECTRIC SEMICONDUCTOR DEVICE AND METHOD FOR FABRICATING THE SAME

CROSS REFERENCE TO RELATED APPLICATION

This application claims the benefits of the Taiwan Patent Application Serial Number 099108379, filed on Mar. 22, 2010, the subject matter of which is incorporated herein by reference.

BACKGROUND OF THE INVENTION

1. Field of the Invention

The present invention relates to an organic photoelectric semiconductor device and a method for manufacturing the same and, more particularly, to an organic photoelectric semiconductor device including quaternary group VA salts in an organic salt-containing layer and a method for manufacturing the same.

2. Description of Related Art

Organic photoelectric semiconductor devices, such as small molecule organic light-emitting diodes (OLEDs), polymer light-emitting diodes (PLEDs), magnetic small molecule organic light-emitting diodes, magnetic polymer light-emitting diodes, small molecule organic solar cells, polymer solar cells, magnetic molecule organic solar cells, magnetic polymer solar cells etc., have attracted considerable attention due to their potential advantages such as flexibility, lightweight and low fabrication cost over their inorganic counterparts. Among organic photoelectric semiconductor devices, organic light-emitting diodes (e.g. small molecule organic light-emitting diodes, polymer light-emitting diodes, magnetic small molecule organic light-emitting diodes, magnetic polymer light-emitting diodes) and organic solar cells (e.g. small molecule organic solar cells, polymer solar cells, magnetic molecule organic solar cells, magnetic polymer solar cells) are particularly interesting owing to the increasing demand for new renewable energies and numerous advantages of organic light-emitting diodes, such as wide viewing angles, low manufacturing cost, high response rate (one hundred times or more faster than that of LCD), low power consumption, good adaptability for DC driving model in portable electronic products, light weight, miniaturization facility, high picture contrast, and high brightness.

In organic photoelectric semiconductor devices, an organic active layer of organic small molecules or polymer molecules is sandwiched between a cathode and an anode. Accordingly, while applying an electric field on an organic photoelectric semiconductor device capable of converting electricity into light (e.g. organic light-emitting diodes), electrons and holes would be respectively injected from the cathode and the anode, and transmitted to the organic active layer, resulting in recombination of electrons and holes and thus emission of light. On the contrary, electrons and holes are generated in an inner part of an organic photoelectric semiconductor device capable of converting light into electricity (e.g. organic solar cells) under illumination, and the generated electrons and holes are transferred to the cathode and the anode, respectively, by the action of internal electric fields. Then, the electrons generated therein would flow out to an external circuit through the cathode, to generate an electric current.

Organic photovoltaic (OPV) technology is still in the early stages of development. Despite the advantages that it already has or may have in the future, the efficiency is still very low compared to the conventional PVs. Thereby, the performance enhancement of OPVs is absolutely necessary if organic solar cells are to dominate the future solar cell market. One important key to high performance organic solar cells is the selection of the electron collecting layer. The purpose of the electron collecting layer is to provide hole blocking capability and a low resistive pathway for efficient electron extraction.

Regarding organic light-emitting diodes, in consideration of conductivity and low interfacial barrier between the organic active layer and the anode/cathode, low-work-function (low-WF) metals and high-work-function (high WF) metals may be used as the cathode and the anode, respectively, to promote the injection of electrons and holes respectively into LUMO and HOMO of the organic active layer. Among them, calcium (Ca), magnesium (Mg), barium (Ba) and lithium (Li) are commonly used low-WF metals. However, these metals have high reactivity and are susceptible to oxidation with moisture and oxygen in air, resulting in the deterioration of electrodes and reduction of electroluminescence (EL) efficiency. In order to overcome the above-mentioned problems, it is desirable to use an environmentally stable metal, such as Al, Ag, or Au. However, these environmentally stable metals have high work function. To overcome injection barrier for electrons and promote electron injection to the organic active layer, the following approaches were suggested: (1) forming an alloy by co-plating various low-WF metals and anti-corrosion metals as the cathode, such as Mg/Ag alloy or Li/Al alloy; and (2) inserting an electron injection layer between the organic active layer and the high-WF metal to reduce the electron-injection barrier and to promote the injection of electrons from the cathode into the organic active layer, resulting in the enhancement of electron-hole recombination.

Many excellent materials with efficient electron-injection ability have been suggested, including: (a) alkali metal compounds, which are commonly applied to an electron injection layer, e.g. metal acetates ($CH_3COOM$, M=Li, Na, K, Rb or Cs), metal fluorides (MF, M=Li, Na, K, Rb or Cs), lithium oxide ($Li_2O$), lithium metaborate ($LiBO_2$), potassiumsilicate ($K_2SiO_3$), or cesium carbonate ($Cs_2CO_3$); (b) oxygen-containing polymers or surfactants, e.g. poly(ethylene glycol) (PEG) doped in emissive organic polymer materials, or a modification layer of neutral surfactants ($C_mH_{2m+1}(OC_kH_{2k})_n$ OH) or poly(ethylene oxide) (PEO) to modify the interface between the organic active layer and the Al electrode; (c) ionic polymers appliable to polymer light-emitting diodes, e.g. sodium sulfonated polystyrene (SSPS); (d) metal oxides having a conduction band between about 3.8 eV and 4.3 eV and applicable to PLEDs, which provide higher electron mobility than hole mobility to thereby confine holes to the organic active layer and to enhance the recombination, e.g. n-type semiconductor materials ($TiO_2$, ZnO etc.); and (e) ionic conjugated polymers, which can enhance the electron-injection efficiency and improve the EL intensity of devices, e.g. poly(fluorene)-based conjugated polymers.

However, the above-mentioned electron-injection materials have drawbacks, including: (I) these materials only work well with Al and thus the choice of the cathode metal is limited; (2) synthesis difficulty of partial materials causes the reduction of yield and high manufacturing cost; and (3) these materials cannot be applied to both a solution fabrication process and a dry process, and thus the application is restricted.

SUMMARY OF THE INVENTION

The object of the present invention is to provide novel organic photoelectric semiconductor devices in which quaternary group VA salts are applied to promote the transmission of electrons, and methods for fabricating the same. In the novel organic photoelectric semiconductor devices according to the present invention, the quaternary group VA salts can work well with environmentally stable metals and have high stability so as to enhance the life of devices. In particular, the quaternary group VA salts according to the present invention can reduce the interfacial barrier between the organic active layer and the high-work-function metal electrode no matter what the material of the cathode is (including, but not limited to, Al, Ag, Au, Cu or Fe), and thus can enhance the electron-hole recombination for organic light-emitting diodes and electron-extraction for organic solar cells. Additionally, the layer including the quaternary group VA salts can be formed by a solution fabrication process or a dry process according to the kinds and properties of devices, and thereby is potentially applicable to many devices. Moreover, the layer of the quaternary group VA salts can protect the organic active layer from being damaged during evaporation deposition of a metal electrode, and prevent the element diffusion from a metal electrode into the organic active layer to enhance the manufacturing yield and life of devices.

To achieve the object, the present invention provides an organic photoelectric semiconductor device, including: a first electrode; an organic active layer disposed over the first electrode; an organic salt-containing layer disposed over the organic active layer, where the organic salt-containing layer includes quaternary group VA salts of cations represented by the following formula (I) or derivatives thereof and anions; and a second electrode, disposed over the organic salt-containing layer,

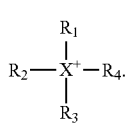

In the formula (I), X is N or P, and $R_1$, $R_2$, $R_3$ and $R_4$ each independently are $C_{1-20}$ alkyl, $C_{1-20}$ alkenyl or $C_{1-20}$ alkynyl.

The organic photoelectric semiconductor device according to the present invention may further include: a hole injection layer or a hole collecting layer, disposed between the first electrode and the organic active layer. More specifically, in the case of the organic photoelectric semiconductor device being an organic light-emitting diode (e.g. a small molecule organic light-emitting diode, a polymer light-emitting diode, a magnetic small molecule organic light-emitting diode, a magnetic polymer light-emitting diode), a hole injection layer may be further included, and the organic salt-containing layer is used as an electron injection layer. If the organic photoelectric semiconductor device is an organic solar cell (e.g. a small molecule organic solar cell, a polymer solar cell, a magnetic molecule solar cell, a magnetic polymer solar cell), a hole collecting layer may be further included, and the organic salt-containing layer is used an electron collecting layer.

The present invention further provides a method for manufacturing an organic photoelectric semiconductor device, more particularly to a conventional organic photoelectric semiconductor device, including: (A) providing a first electrode; (B) forming an organic active layer over the first electrode; (C) forming an organic salt-containing layer disposed over the organic active layer, where the organic salt-containing layer includes quaternary group VA salts of cations represented by the above-mentioned formula (I) or derivatives thereof and anions; and (D) forming a second electrode over the organic salt-containing layer.

The above-mentioned method for manufacturing an organic photoelectric semiconductor device may further include a step (A1) between the step (A) and the step (B): forming a hole injection layer or a hole collecting layer over the first electrode, and the organic active layer is formed over the hole injection layer or the hole collecting layer. More specifically, in the case of the organic photoelectric semiconductor device being an organic light-emitting diode (e.g. a small molecule organic light-emitting diode, a polymer light-emitting diode, a magnetic small molecule organic light-emitting diode, a magnetic polymer light-emitting diode), the manufacturing method may further include a step (A1) between the step (A) and the step (B): forming a hole injection layer over the first electrode, and the organic active layer is formed over the hole injection layer. If the organic photoelectric semiconductor device is an organic solar cell (e.g. a small molecule organic solar cell, a polymer solar cell, a magnetic molecule solar cell, a magnetic polymer solar cell), the manufacturing method may further include a step (A1) between the step (A) and the step (B): forming a hole collecting layer over the first electrode, and the organic active layer is formed over the hole collecting layer.

Also, the present invention provides another method for manufacturing an organic photoelectric semiconductor device, more particularly to an inverted organic photoelectric semiconductor device, including: (A) providing a second electrode; (B) forming an organic salt-containing layer disposed over the second electrode, where the organic salt-containing layer includes quaternary group VA salts of cations represented by the above-mentioned formula (I) or derivatives thereof and anions; (C) forming an organic active layer over the organic salt-containing layer; and (D) forming first electrode over the organic active layer.

The above-mentioned another method for manufacturing an organic photoelectric semiconductor device may further include a step (C1) between the step (C) and the step (D): forming a hole injection layer or a hole collecting layer over the organic active layer, and the first electrode is formed over the hole injection layer or the hole collecting layer. More specifically, in the case of the organic photoelectric semiconductor device being an organic light-emitting diode (e.g. a small molecule organic light-emitting diode, a polymer light-emitting diode, a magnetic small molecule organic light-emitting diode, a magnetic polymer light-emitting diode), the manufacturing method may further include a step (C1) between the step (C) and the step (D): forming a hole injection layer over the organic active layer, and the first electrode is formed over the hole injection layer. If the organic photoelectric semiconductor device is an organic solar cell (e.g. a small molecule organic solar cell, a polymer solar cell, a magnetic molecule solar cell, a magnetic polymer solar cell), the manufacturing method may further include a step (C1) between the step (C) and the step (D): forming a hole collecting layer over the organic active layer, and the first electrode is formed over the hole collecting layer.

In the present invention, the term "alkyl" refers to a straight or branched hydrocarbon. Examples of alkyl include, but are not limited to, methyl, ethyl, n-propyl, i-propyl, n-butyl, i-butyl, and t-butyl.

In the present invention, the term "alkenyl" refers to a straight or branched hydrocarbon containing one or more double bonds. Examples of alkenyl include, but are not limited to, ethenyl, propenyl, allyl, and 1,4-butadienyl.

In the present invention, the term "alkynyl" refers to a straight or branched hydrocarbon containing one or more triple bonds. Examples of alkynyl include, but are not limited to, ethynyl, propynyl and butynyl.

The above-mentioned alkyl, alkenyl and alkynyl include both substituted and unsubstituted moieties. The term "substituted" refers to one or more substituents (which may be the same or different), each replacing a hydrogen atom.

Regarding the cations represented by the formula (I), $R_1$, $R_2$, $R_3$ and $R_4$ may be the same or different, preferably, $R_1$, $R_2$, $R_3$ and $R_4$ each independently are unsubstituted $C_{1-20}$ alkyl, unsubstituted $C_{1-20}$ alkenyl or unsubstituted $C_{1-20}$ alkynyl, and more preferably are unsubstituted $C_{1-16}$ alkyl, unsubstituted $C_{1-16}$ alkenyl or unsubstituted $C_{1-16}$ alkynyl. Examples of the cations represented by the formula (I) include, but are not limited to, tetraoctylammonium cations, tetrabutylammonium cations, tetradodecylammonium cations, tetrahexadecylammonium cations, tetrabutylphosphonium cations, tetraethylammonium cations, methyltrioctylammonium cations, trimethyloctylammonium cations.

Regarding the quaternary group VA salts, the anions are not particularly limited, which may be any organic anions or inorganic anions. Examples of anions include, but are not limited to, $F^-$, $Cl^-$, $Br^-$, $I^-$, $BH_4^-$, $PF_6^-$, $SO_4^{2-}$ or $PO_4^{3-}$.

In the present invention, the first electrode preferably is an anode, and may be a conductive substrate or an electrode layer. More specifically, the first electrode preferably is a conductive substrate having a conductive layer over a substrate in a conventional organic photoelectric semiconductor device, while the first electrode preferably is an electrode layer, and more preferably is a metal electrode layer in an inverted organic photoelectric semiconductor device.

In the present invention, the second electrode preferably is a cathode, and may be a conductive substrate or an electrode layer. More specifically, the second electrode preferably is an electrode layer, and more preferably is a metal electrode layer in a conventional organic photoelectric semiconductor device, while the second electrode preferably is a conductive substrate having a conductive layer over a substrate in an inverted organic photoelectric semiconductor device.

In the present invention, the substrate is not particularly limited and may be any conventional suitable substrate, such as a glass substrate, a plastic substrate, a flexible substrate or a silicon substrate. In addition, the conductive layer is not particularly limited and may be any conventional suitable conductive layer. Moreover, the conductive layer may be in a single-layered structure (e.g. an ITO layer, an FTO layer etc.) or in a multi-layered structure (e.g. a two-layered structure of ZnO/ITO or ZnO/FTO). Accordingly, examples of the conductive substrate include, but are not limited to, an ITO-coated glass substrate, an FTO-coated glass substrate, an FTO-coated silicon substrate, a ZnO/ITO-coated glass substrate, and a ZnO/FTO-coated glass substrate.

In the present invention, the metal electrode layer preferably is a stable metal electrode layer, which may be made of a high-work-function metal material, such as Al, Ag, Au, Cu, Fe and a combination thereof.

In the present invention, the quaternary group VA salts can be assembled into a nano-lamellar structure to form the organic salt-containing layer, which preferably exhibits a dipole moment pointing from the second electrode to the organic active layer and be used as an electron injection layer to promote the electron-injection or an electron collecting layer to promote the electron-extraction. The property of the layer underneath the organic salt-containing layer may affect the direction of the dipole moment. In detail, in the case of forming the organic salt-containing layer on a hydrophobic surface, the anions of the quaternary group VA salts preferably are rejected away by the hydrophobic surface, and thereby the organic salt-containing layer can exhibit a dipole moment pointing toward the hydrophobic surface. For example, when the organic salt-containing layer is formed on an organic active layer with a hydrophobic surface for a conventional organic light-emitting diode, the organic salt-containing layer preferably exhibits a dipole moment pointing from the second electrode (i.e. a cathode) to the organic active layer and is used as an electron injection layer to promote the electron-injection. Similarly, when the organic salt-containing layer is formed on a an organic active layer with a hydrophobic surface for a conventional organic solar cell, the organic salt-containing layer preferably exhibits a dipole moment pointing from the second electrode (i.e. a cathode) to the organic active layer and is used as an electron collection layer to promote the electron-extraction. On the other hand, in the case of forming the organic salt-containing layer on a hydrophilic surface, the anions of the quaternary group VA salts preferably are attracted by the hydrophilic surface, and thereby the organic salt-containing layer can exhibit a dipole moment pointing outward from the hydrophilic surface. For example, when the organic salt-containing layer is formed on a second electrode (i.e. a cathode) with a hydrophilic surface for an inverted organic light-emitting diode, the organic salt-containing layer preferably exhibits a dipole moment pointing from the second electrode to the organic active layer and is used as an electron injection layer to promote the electron-injection. Similarly, when the organic salt-containing layer is formed on a second electrode (i.e. a cathode) with a hydrophilic surface for an inverted organic solar cell, the organic salt-containing layer preferably exhibits a dipole moment pointing from the second electrode to the organic active layer and is used as an electron collecting layer to promote the electron-extraction.

In the present invention, the electron injection layer refers to a layer capable of promoting the transmission of electrons into the inner part of the device (for example, from the second electrode to the organic active layer), while the hole injection layer refers to a layer capable of promoting the transmission of holes into the inner part of the device (for example, from the first electrode to the organic active layer).

In the present invention, the electron collecting layer refers to a layer capable of promoting the transmission of electrons out of the device (for example, from the organic active layer to the second electrode), while the hole collecting layer refers to a layer capable of promoting the transmission of holes out of the device (for example, from the organic active layer to the first electrode).

In the present invention, the material of the hole injection layer is not particularly limited, and may be any conventional suitable hole-injection material, such as poly(3,4-ethylenedioxy thiophene): polystyrenesulfonate (PEDOT:PSS).

In the present invention, the material of the hole collecting layer is not particularly limited, and may be any conventional suitable hole-collecting material, such as poly(3,4-ethylenedioxy thiophene): polystyrenesulfonate (PEDOT:PSS).

In the present invention, the material of the organic active layer is not particularly limited, and may be any conventional suitable material. In addition, the thickness of the organic active layer dependents on its material and is not particularly limited. Herein, the organic active layer may be an organic emission layer for organic light-emitting diodes, which preferably is a conjugated polymer layer of poly(9,9-dioctylfluorene (PFO), poly(para-phenylene vinylene) (PPV) or a derivative thereof. Also, the organic active layer may be an organic intrinsic layer for organic solar cells, which preferably is a layer of poly(3-hexylthiophene): phenyl-C61-butyric acid methyl ester (P3HT:PCBM).

In the present invention, the organic salt-containing layer can be formed by a solution fabrication process or a dry process, and thereby is potentially applicable to many devices. Accordingly, one of the above-mentioned processes may be selected to form the organic salt-containing layer in consideration of convenience. Herein, examples of the dry process include, but are limited to, vapor deposition and ion beam deposition, and the solution fabrication process may be performed by, for example, spin coating or ink-jet printing.

In the present invention, the solution fabrication process may include the following steps: dissolving the quaternary group VA salts in a polar organic solvent to form a solution, and providing the solution onto the organic active layer or the second electrode. Accordingly, the solution fabrication process is advantageous to the reduction of manufacturing cost. Herein, the polar organic solvent is not particularly limited, and may be any conventional suitable polar organic solvent, which can inhibit the damages on a layer underneath the organic salt-containing layer. Examples of the polar solvent include, but are not limited to, acetone, dimethyl carbonate, ethanol, iso-propanol, 2-methoxyethanol, 2-ethoxyethanol or a mixture thereof.

As above-mentioned, the present invention can efficiently reduce the interfacial barrier between the organic active layer and the high-work-function metal electrode and to enhance the electron-hole recombination for organic light-emitting diodes and electron-extraction for organic solar cells by insertion of an organic salt-containing layer including quaternary group VA salts.

Other objects, advantages, and novel features of the invention will become more apparent from the following detailed description when taken in conjunction with the accompanying drawings.

DETAILED DESCRIPTION OF THE PREFERRED EMBODIMENT

Hereafter, examples will be provided to illustrate the embodiments of the present invention. Other advantages and effects of the invention will become more apparent from the disclosure of the present invention. It should be noted that these accompanying figures are simplified. Other various aspects in the invention also may be practiced or applied by definite embodiments, and various modifications and variations can be made without departing from the spirit of the invention based on various concepts and applications.

Figure 1:
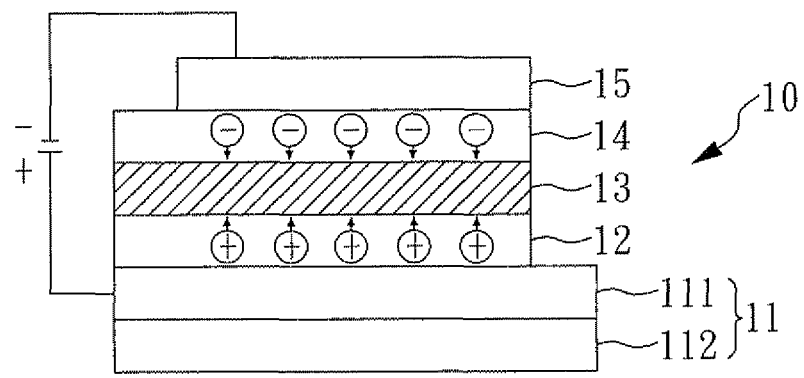
FIG. 1 shows a cross-sectional view of an organic photoelectric semiconductor device according to the first aspect of the present invention.

As shown in FIG. 1, the first aspect of an organic photoelectric semiconductor device 10 according to the present invention is a conventional organic light-emitting diode, which includes: a first electrode 11; a hole injection layer 12, disposed over the first electrode 11; an organic active layer 13, disposed over the hole injection layer 12; an organic salt-containing layer 14, disposed over the organic active layer 13; and a second electrode 15, disposed over the organic salt-containing layer 14. In the first aspect, the first electrode 11 is a conductive substrate as an anode, which has a conductive layer 111 being as an anode electrode layer on a substrate 112. Accordingly, holes can be injected from the conductive layer 111 to the hole injection layer 12. Herein, the substrate 112 may be a glass substrate, a plastic substrate, a flexible substrate or a silicon substrate, and the conductive layer 111 may be made of ITO or FTO. For example, the first electrode 11 may be an ITO-coated glass substrate, an FTO-coated glass substrate, or a FTO-coated silicon substrate. In the first aspect, an ITO-coated glass substrate is taken as the first electrode 11. Subsequently, as shown in FIG. 1, the hole injection layer 12, the organic active layer 13, the organic salt-containing layer 14 and the second electrode 15 are stacked over the first electrode 11 in sequence.

According to the first aspect, the hole injection layer 12 is formed between the conductive layer 111 of the first electrode 11 and the organic active layer 13 to promote the transmission of holes from conductive layer 111 of the first electrode 11 to the organic active layer 13. Herein, the material of the hole injection layer 12 may be poly(3,4-ethylenedioxy thiophene): polystyrenesulfonate (PEDOT:PSS), but is not limited thereto. In addition, the thickness of the hole injection layer 12 preferably ranges from 30 nm to 40 nm.

According to the first aspect, the organic active layer 13 may be called an organic emission layer, which is formed between the hole injection layer 12 and the organic salt-containing layer 14. Herein, the organic active layer 13 preferably is a conjugated polymer layer of poly(9,9-dioctylfluorene (PFO), poly(para-phenylene vinylene) (PPV) or a derivative thereof. In addition, the thickness of the organic active layer 13 dependents on its material and is not particularly limited. In the first aspect, the material of the organic active layer 13 is an organic polymer material of green-emissive PFO.

According to the first aspect, the organic salt-containing layer 14 is also called an electron injection layer, which is formed between the organic active layer 13 and the second electrode 15. Herein, the organic salt-containing layer 14 includes quaternary group VA salts of cations represented by the following formula (I) or derivatives thereof and anions,

(I)

where X is N or P, and $R_1$, $R_2$, $R_3$ and $R_4$ each independently are $C_{1-20}$ alkyl, $C_{1-20}$ alkenyl or $C_{1-20}$ alkynyl. Preferably, $R_1$, $R_2$, $R_3$ and $R_4$ each independently are unsubstituted $C_{1-20}$ alkyl, unsubstituted $C_{1-20}$ alkenyl or unsubstituted $C_{1-20}$ alkynyl. Moreover, the anions are preferably $F^-$, $Cl^-$, $Br^-$, $I^-$, $BPh_4^-$, $BH_4^-$, $PF_6^-$, $SO_4^{2-}$ or $PO_4^{3-}$, but are not limited thereto. In the first aspect, the organic salt-containing layer 14 is used to promote the transmission of electrons from the second electrode 15 to the organic active layer 13. Herein, the organic salt-containing layer 14 may range from several nanometers to tens of nanometers in thickness.

According to the first aspect, the second electrode 15 is used as a cathode and formed on the organic salt-containing layer 14. The second electrode 15 preferably is any stable metal electrode, which may be made of a high work function metal material (including, but not limited to, Al, Ag, Au, Cu, Fe and a combination thereof), and more preferably is Al. The work functions of Al, Ag, Au, Cu and Fe are 4.28 eV, 4.26 eV, 5.1 eV, 4.65 eV and 4.5 eV, respectively. In the first aspect, the second electrode 15 is used to inject electrons to the organic salt-containing layer 14 being as an electron injection layer.

According to the first aspect, the organic salt-containing layer 14 can be formed by a solution fabrication process or a dry process. Accordingly, one of the above-mentioned processes may be selected to form the organic salt-containing layer 14 in consideration of the convenience. For example, in the case of the organic photoelectric semiconductor device 10 being a small molecule organic light-emitting diode, the organic salt-containing layer 14 may be formed by a dry process, such as vapor deposition or ion beam deposition. Alternatively, if the organic photoelectric semiconductor device 10 is a polymer light-emitting diode, a solution fabrication process may be chosen to form the organic salt-containing layer 14, which includes the following steps: dissolving the quaternary group VA salts in a polar organic solvent to form a solution, and providing the solution onto the organic active layer 13 to form a thin film (i.e. the organic salt-containing layer 14). Herein, the polar solvent preferably is acetone, dimethyl carbonate, ethanol, iso-propanol, 2-methoxyethanol, 2-ethoxyethanol or a mixture thereof. Additionally, the solution may be provided onto the organic active layer 13 by spin coating or ink-jet printing. In the process for forming the organic salt-containing layer 14, the self-assembly of the quaternary group VA salts on the hydrophobic organic active layer 13 would provide an interfacial dipole pointing from the second electrode 15 to the organic active layer 13 to promote electron injection while using a high-WF metal as the second electrode, resulting in the enhancement of electron-injection efficiency of the organic photoelectric semiconductor device 10.

Figure 2:
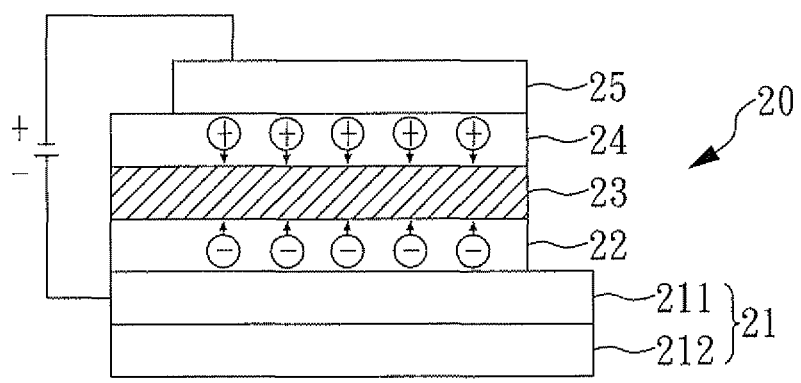
FIG. 2 shows a cross-sectional view of an organic photoelectric semiconductor device according to the second aspect of the present invention.

As shown in FIG. 2, the second aspect of an organic photoelectric semiconductor device 20 according to the present invention is an inverted organic light-emitting diode, which includes: a second electrode 21; an organic salt-containing layer 22, disposed over the second electrode 21; an organic active layer 23, disposed over the organic salt-containing layer 22; a hole injection layer 24, disposed over the organic active layer 23; and a first electrode 25, disposed over the hole injection layer 24. Alternatively, by the inverse view of FIG. 2, the organic photoelectric semiconductor device 20 according to the second aspect includes: a first electrode 25; a hole injection layer 24, disposed over the first electrode 25; an organic active layer 23, disposed over the hole injection layer 24; an organic salt-containing layer 22, disposed over the organic active layer 23; and a second electrode 21, disposed over the organic salt-containing layer 22. In the second aspect, the second electrode 21 is a conductive substrate as a cathode, which has a two-layered conductive layer 211 being as a cathode electrode layer on a substrate 212. Accordingly, electrons can be injected from the conductive layer 211 to the organic salt-containing layer 22 being as an electron injection layer. Herein, the substrate 212 may be a glass substrate, a plastic substrate, a flexible substrate or a silicon substrate, and the conductive layer 211 may be made of ITO or FTO and ZnO in a two-layered structure. In the second, an ITO/ZnO glass substrate is taken as the second electrode 21. Subsequently, as shown in FIG. 2, the organic salt-containing layer 22, the organic active layer 23, the hole injection layer 24 and the first electrode 25 are stacked over the conductive layer 211 of the second electrode 21 in sequence.

According to the second aspect, the organic salt-containing layer 22 is also called an electron injection layer, which is formed between the conductive layer 211 of the second electrode 21 and the organic active layer 23. Herein, the organic salt-containing layer 22 includes quaternary group VA salts of cations represented by the following formula (I) or derivatives thereof and anions,

(I)

where X is N or P, and $R_1$, $R_2$, $R_3$ and $R_4$ each independently are $C_{1-20}$ alkyl, $C_{1-20}$ alkenyl or $C_{1-20}$ alkynyl. Preferably, $R_1$, $R_2$, $R_3$ and $R_4$ each independently are unsubstituted $C_{1-20}$ alkyl, unsubstituted $C_{1-20}$ alkenyl or unsubstituted $C_{1-20}$ alkynyl. Moreover, the anions are preferably $F^-$, $Cl^-$, $Br^-$, $I^-$, $BPh_4^-$, $BH_4^-$, $PF_6^-$, $SO_4^{2-}$ or $PO_4^{3-}$, but are not limited thereto. In the second aspect, the organic salt-containing layer 22 is used to promote the transmission of electrons from the conductive layer 211 of the second electrode 21 to the organic active layer 23. Herein, the organic salt-containing layer 22 may range from several nanometers to tens of nanometers in thickness.

According to the second aspect, the organic active layer 23 may be called an organic emission layer, which is formed between the organic salt-containing layer 22 and the hole injection layer 24. Herein, the organic active layer 23 preferably is a conjugated polymer layer of poly(9,9-dioctylfluorene (PFO), poly(para-phenylene vinylene) (PPV) or a derivative thereof. In addition, the thickness of the organic active layer 23 dependents on its material and is not particularly limited. In the second aspect, the organic active layer 23 is made of green-emissive PFO.

According to the second aspect, the hole injection layer 24 is formed between the organic active layer 23 and the first electrode 25 to promote the transmission of holes from the first electrode 25 to the organic active layer 23. Herein, the material of the hole injection layer 24 may be $MoO_3$, but is not limited thereto. In addition, the thickness of the hole injection layer 24 preferably ten nanometers or less.

According to the second aspect, the first electrode 25 is used as an anode and formed on the hole injection layer 24. The first electrode 25 preferably is any stable metal electrode, which may be made of a high work function metal material (including, but not limited to, Al, Ag, Au, Cu, Fe and a combination thereof), and more preferably is Ag, Au or a combination thereof. In the second aspect, the first electrode 25 is used to inject holes to the hole injection layer 24.

According to the second aspect, the organic salt-containing layer 22 can be formed by a solution fabrication process or a dry process. Accordingly, one of the above-mentioned processes may be selected to form the organic salt-containing layer 22 in consideration of the convenience. For example, in the case of the organic photoelectric semiconductor device 20 being a small molecule organic light-emitting diode, the organic salt-containing layer 22 may be formed by a dry process, such as vapor deposition or ion beam deposition. Alternatively, if the organic photoelectric semiconductor device 20 is a polymer light-emitting diode, a solution fabrication process may be chosen to form the organic salt-containing layer 22, which includes the following steps: dissolving the quaternary group VA salts in a polar organic solvent to form a solution, and providing the solution onto the conductive layer 211 of the second electrode 21 to form a thin film (i.e. the organic salt-containing layer 22). Herein, the polar solvent preferably is acetone, dimethyl carbonate, ethanol, iso-propanol, 2-methoxyethanol, 2-ethoxyethanol or a mixture thereof. Additionally, the solution may be provided onto the organic active layer 22 by spin coating or ink-jet printing. In the process for forming the organic salt-containing layer 22, the self-assembly of the quaternary group VA salts on the hydrophilic conductive layer 211 of the second electrode 21 would provide an interfacial dipole pointing from the conductive layer 211 of the second electrode 21 to the organic active layer 23 to promote electron injection from the conductive layer 211 of the second electrode 21, resulting in the enhancement of electron-injection efficiency of the organic photoelectric semiconductor device 20.

Figure 3A:
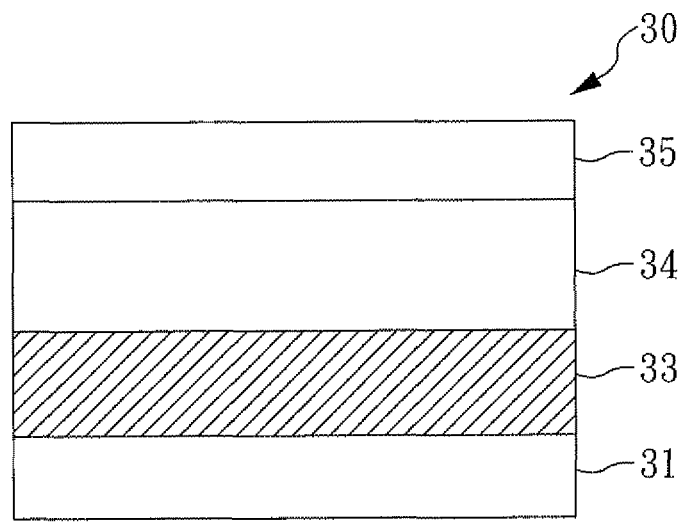
FIGS. 3A and 3B show cross-sectional views of organic photoelectric semiconductor devices according to the third aspect of the present invention.

As shown in FIG. 3A, the third aspect of an organic photoelectric semiconductor device 30 according to the present invention is an organic solar cell, which includes: a first electrode 31; an organic active layer 33, disposed over the first electrode 31; an organic salt-containing layer 34, disposed over the organic active layer 33; and a second electrode e 35, disposed over the organic salt-containing layer 34. In the third aspect, the first electrode 31 is used as an anode, and may be an ITO-coated glass substrate or an FTO-coated glass substrate. In the third aspect, an ITO-coated glass substrate is taken as the first electrode 31. Subsequently, as shown in FIG. 3A, the organic active layer 33, the organic salt-containing layer 34 and the second electrode 35 are stacked over the first electrode 31 in sequence.

Figure 3B:
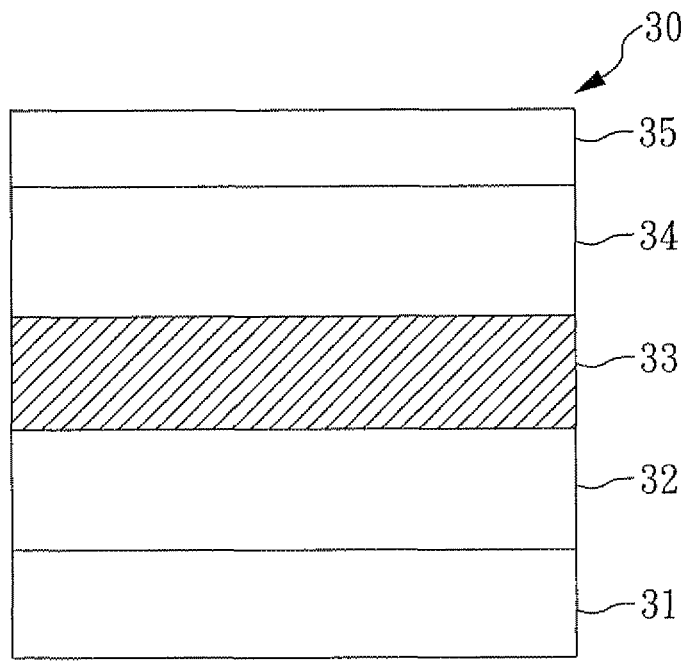

The organic photoelectric semiconductor device 30 according to the third aspect may further include a hole collecting layer 32, as shown in FIG. 3B, which is formed between the first electrode 31 and the organic active layer 33 to promote the transmission of holes from the organic active layer 33 to the first electrode 31. Herein, the material of the hole collecting layer 32 may be PEDOT:PSS, but is not limited thereto. In addition, the thickness of the hole collecting layer 32 preferably ranges from 30 nm to 40 nm.

According to the third aspect, the organic active layer 33 is formed between the first electrode 31 and the organic salt-containing layer 34 (as shown in FIG. 3A), or between hole collecting layer 32 and the organic salt-containing layer 34 (as shown in FIG. 3B). Herein, the organic active layer 33 preferably is a layer of poly(3-hexylthiophene): phenyl-C61-butyric acid methyl ester (P3HT:PCBM). In addition, the thickness of the organic active layer 33 dependents on its material and is not particularly limited.

According to the third aspect, the organic salt-containing layer 34 is also called an electron collecting layer, which is formed between the organic active layer 33 and the second electrode 35. Herein, the organic salt-containing layer 34 includes quaternary group VA salts of cations represented by the following formula (I) or derivatives thereof and anions,

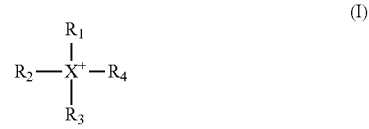

$$R_2-\underset{R_3}{\overset{R_1}{\underset{|}{\overset{|}{X^+}}}}-R_4 \quad (I)$$

where X is N or P, and $R_1$, $R_2$, $R_3$ and $R_4$ each independently are $C_{1-20}$ alkyl, $C_{1-20}$ alkenyl or $C_{1-20}$ alkynyl. Preferably, $R_1$, $R_2$, $R_3$ and $R_4$ each independently are unsubstituted $C_{1-20}$ alkyl, unsubstituted $C_{1-20}$ alkenyl or unsubstituted $C_{1-20}$ alkynyl. Moreover, the anion are preferably $F^-$, $Cl^-$, $Br^-$, $I^-$, $BPh_4^-$, $BH_4^-$, $PF_6^-$, $SO_4^{2-}$ or $PO_4^{3-}$, but are not limited thereto. In the third aspect, the organic salt-containing layer 34 is used to promote the transmission of electrons from the organic active layer 33 to the second electrode 35. Herein, the organic salt-containing layer 34 may range from several nanometers to tens of nanometers in thickness.

According to the third aspect, the second electrode 35 is used as a cathode and formed on the organic salt-containing layer 34. The second electrode 35 preferably is any stable metal electrode, which may be made of a high work function metal material (such as Al, Ag, Au, Cu, Fe and a combination thereof), and more preferably is Al In the third aspect, electrons would be extracted from the second electrode 35.

According to the third aspect, the organic salt-containing layer 34 can be formed by a solution fabrication process or a dry process. Accordingly, one of the above-mentioned processes may be selected to form the organic salt-containing layer 34 in consideration of the convenience. For example, in the case of the organic photoelectric semiconductor device 30 being a small molecule organic solar cell, the organic salt-containing layer 34 may be formed by a dry process, such as vapor deposition or ion beam deposition. Alternatively, if the organic photoelectric semiconductor device 30 is a polymer solar cell, a solution fabrication process may be chosen to form the organic salt-containing layer 34, which includes the following steps: dissolving the quaternary group VA salts in a polar organic solvent to form a solution, and providing the solution onto the organic active layer 33 to form a thin film (i.e. the organic salt-containing layer 34). Herein, the polar solvent preferably is acetone, dimethyl carbonate, ethanol, iso-propanol, 2-methoxyethanol, 2-ethoxyethanol or a mixture thereof. Additionally, the solution may be provided onto the organic active layer 33 by spin coating or ink-jet printing.

EXAMPLE 1

The present example is an embodiment of the above-mentioned first aspect of the organic photoelectric semiconductor device 10. In the present example, an ITO-coated glass substrate was taken as the first electrode 11; the hole injection layer 12 was made of PEDOT:PSS; the organic active layer 13 was made of a green-emissive poly(9,9-dioctylfluorene) derivative (PFO); tetraoctylammonium bromide (TOAB) was used in the organic salt-containing layer 14; and the second electrode 15 was an aluminum electrode.

The process for manufacturing the conventional polymer light-emitting diode according to the present example is illustrated as follows.

First, an ITO-coated glass substrate was taken as the first electrode 11 (i.e. an anode), and then covered with PEDOT:PSS by spin coating, thus forming the hole injection layer 12 on the first electrode 11. Subsequently, the organic active layer 13 was formed by spin-casting PFO from toluene solution onto the hole injection layer 12. The PFO film was baked at 65° C. for 30 minutes. Next, the ionic salt solution, which contained TOAB, was prepared from 0.2 wt % 2-methoxyethanol and stirred overnight prior to use. The solution containing the ionic salt was spin-coated onto the surface of the organic active layer 13 at 8000 rpm for 60 s and then the film was baked at 60° C. for 10 minutes to from the organic salt-containing layer 14 being as an electron injection layer. Finally, an aluminum layer is formed on the organic salt-containing layer 14 by vacuum thermal evaporation to form the second electrode 15 (i.e. a cathode). In the present example, the active area of the polymer light-emitting diode was 0.06 cm$^2$. All procedures, except for the casting of the PEDOT:PSS layer, were performed in a N$_2$-filled glove box to inhibit damages on the diode caused by moisture and oxygen in air.

EXAMPLE 2

The PLED according to the present example was almost the same as that was illustrated in Example 1, except that the second electrode 15 was an Ag electrode.

EXAMPLE 3

The PLED according to the present example was almost the same as that was illustrated in Example 1, except that the second electrode 15 was an Au electrode.

EXAMPLE 4

The PLED according to the present example was almost the same as that was illustrated in Example 1, except that the organic salt-containing layer 14 was made of tetrabutylammonium bromide.

EXAMPLE 5

The PLED according to the present example was almost the same as that was illustrated in Example 1, except that the organic salt-containing layer 14 was made of tetradodecylammonium bromide.

EXAMPLE 6

The PLED according to the present example was almost the same as that was illustrated in Example 1, except that the organic salt-containing layer 14 was made of tetrahexadecylammonium bromide.

EXAMPLE 7

The PLED according to the present example was almost the same as that was illustrated in Example 1, except that the organic salt-containing layer 14 was made of tetrabutylphosphonium bromide.

EXAMPLE 8

The PLED according to the present example was almost the same as that was illustrated in Example 1, except that the organic salt-containing layer 14 was made of tetraethylammonium bromide.

EXAMPLE 9

The PLED according to the present example was almost the same as that was illustrated in Example 1, except that the organic salt-containing layer 14 was made of methyltrioctylammonium bromide.

EXAMPLE 10

The PLED according to the present example was almost the same as that was illustrated in Example 1, except that the organic salt-containing layer 14 was made of trimethyloctylammonium bromide.

EXAMPLE 11

The PLED according to the present example was almost the same as that was illustrated in Example 1, except that the organic salt-containing layer 14 was made of tetraoctylammonium chloride.

EXAMPLE 12

The PLED according to the present example was almost the same as that was illustrated in Example 1, except that the organic salt-containing layer 14 was made of tetrabutylammonium tetraphenylborate.

EXAMPLE 13

The present example is an embodiment of the above-mentioned second aspect of the organic photoelectric semiconductor device 20. In the present example, an ITO/ZnO substrate was taken as the second electrode 21; the organic salt-containing layer 22 was made of tetraoctylammonium bromide (TOAB); green-emissive poly(9,9-dioctylfluorene) derivative (PFO) was used in the organic active layer 23; the hole injection layer 24 was made of MoO$_3$; and the first electrode 25 was a Au/Ag electrode.

The process for manufacturing the inverted polymer light-emitting diode according to the present example is illustrated as follows.

First, a ZnO thin film deposited on ITO was prepared by the sol-gel technology. Zinc acetate dehydrate as a precursor was dissolved in a mixture of 2-methoxyethanol and 0.1 M acetic acid aqueous solution at a 1:1 volume ratio. The concentration of zinc acetate was 0.1 g/ml. The mixing solution was spin-coated on an ITO-coated glass substrate and the layers were subsequently annealed, at 450° C. for 30 min to form a ZnO film of about 100 nm in thickness, thus obtaining the second electrode 21 (i.e. a cathode) having ITO/ZnO as the conductive layer 211. Subsequently, the solution of TOAB prepared from 0.2 wt % 2-methoxyethanol was spin-coated onto the surface of ZnO at 2000 rpm for 60 s, and the film was baked at 60° C. for 10 minutes to form the organic salt-containing layer 22 as an electron injection layer on the second electrode 21. Then, PFO was spin-coated on the top of the organic salt-containing layer 22 and baked at 65° C. for 30 minutes, thus forming the organic active layer 23. Finally, the hole injection layer 24 was formed by thermally evaporating a $MoO_3$ interfacial layer with a thickness of 6 nm onto the organic active layer 23, followed by the vacuum evaporation of Au (20 nm)/Ag (80 nm) as the first electrode 25 (i.e. an anode). All procedures, expect for the preparation of the ZnO layer, were performed in a $N_2$-filled glove box.

EXAMPLE 14

The present example is an embodiment of the above-mentioned third aspect of the organic photoelectric semiconductor device 30. In the present example, an ITO-coated glass substrate was taken as the first electrode 31; the hole collecting layer 32 was made of PEDOT:PSS; a layer of P3HT:PCBM was used as the organic active layer 33; the organic salt-containing layer 34 was made of tetraoctylammonium bromide (TOAB); and the second electrode 35 was an aluminum electrode.

The process for manufacturing the conventional polymer light-emitting diode according to the present example is illustrated as follows.

First, an 1TO-coated glass substrate was taken as the first electrode 31 (i.e. an anode), and then PEDOT:PSS was spin-coated onto the first electrode 31 and baked at 150° C. for 30 min to form the hole collecting layer 32 on the first electrode 31. Subsequently, P3HT (Nano-c) and PCBM (Nano-c) has a ratio of 1:1 with a concentration of 2 wt % in 1,2-dichlorobenzene, The blend was stirred for at least 24 hr at room temperature, and spin-coated onto the hole collecting layer 32 at 650 rpm for 60 s, followed by solvent annealing, to form the organic active layer 33 on the hole collecting layer 32. Next, the ionic salt solution, which contained TOAB, was prepared from 0.2 wt % ethanol and stirred overnight prior to use. The solution containing the ionic salt was spin-coated onto the surface of the organic active layer 33 at 8000 rpm for 60 s and then the film was baked at 40° C. for 10 minutes to from the organic salt-containing layer 34 being as an electron collecting layer. Finally, an aluminum layer is formed on the organic salt-containing layer 34 by vacuum thermal evaporation to form the second electrode 25 (i.e. a cathode). In the present example, the active area of the polymer light-emitting diode was 0.06 $cm^2$. All procedures, except for the casting of the PEDOT:PSS layer, were performed in a $N_2$-filled glove box.

EXAMPLE 15

The polymer solar cell according to the present example was almost the same as that was illustrated in Example 14, except that the organic salt-containing layer 34 was made of tetrahexadecylammonium bromide.

COMPARATIVE EXAMPLE 1

The PLED according to the present example was almost the same as that was illustrated in Example 1, except that no organic salt-containing layer was included.

COMPARATIVE EXAMPLE 2

The PLED according to the present example was almost the same as that was illustrated in Example 2, except that no organic salt-containing layer was included.

COMPARATIVE EXAMPLE 3

The PLED according to the present example was almost the same as that was illustrated in Example 3, except that no organic salt-containing layer was included.

COMPARATIVE EXAMPLE 4

The PLED according to the present example was almost the same as that was illustrated in Example 1, except that the organic salt-containing layer 14 was made of ammonium bromide.

COMPARATIVE EXAMPLE 5

The PLED according to the present example was almost the same as that was illustrated in Example 13, except that no organic salt-containing layer 14 was included.

COMPARATIVE EXAMPLE 6

The polymer solar cell according to the present example was almost the same as that was illustrated in Example 14, except that no organic salt-containing layer 34 was included.

COMPARATIVE EXAMPLE 7

The polymer solar cell according to the present example was almost the same as that was illustrated in Example 14, except that organic salt-containing layer 34 was made of ammonium bromide.

TEST EXAMPLE 1

In order to determine the effect of TOAB on the work function of the PFO surface, the ultra-violet photoelectron spectroscopy (UPS) measurements were performed on modified surfaces and compared to that of a bare PFO substrate.

The UPS experiments were carried out in VG CLAM4 surface analysis system, whose illumination was a non-monochromatic He(I) UV source (21.21 eV). The total energy resolution of the measurement was 0.38 eV. The entire process was performed in a multi-chamber ultra-high vacuum system, which included the UPS analysis chamber base ($P_{base}$~$8 \times 10^{-10}$ Torr) and the preparation chamber ($P_{base}$~$9 \times 10^{-10}$ Torr).

Figure 4:
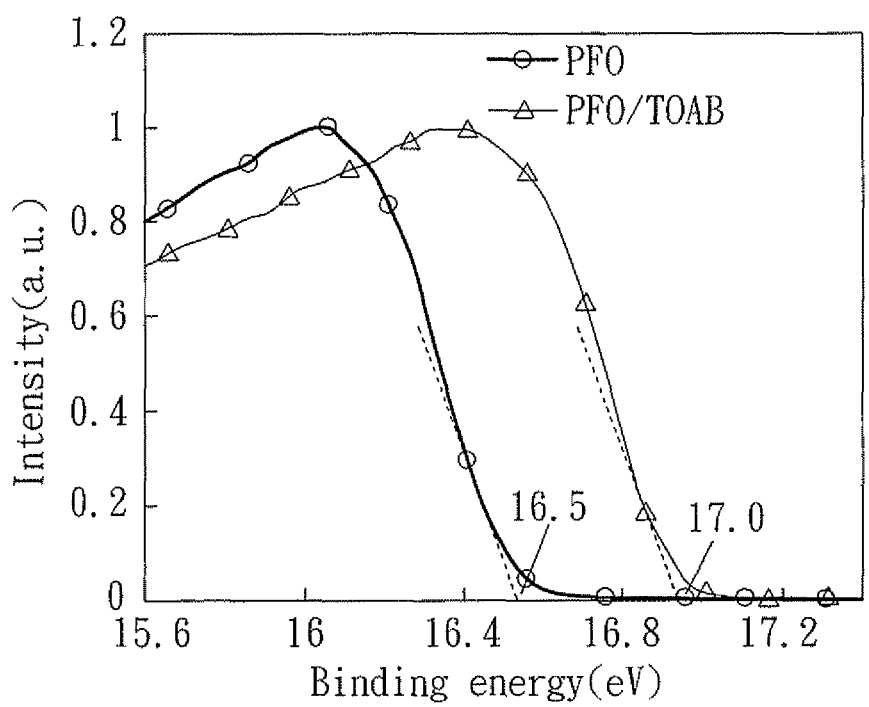
FIG. 4 shows an ultra-violet photoelectron spectroscopy (UPS) spectra taken from PFO surface and TOAB on PFO surface.

FIG. 4 shows the UPS spectra in the secondary cutoff ($E_{cutoff}$) region recorded from PFO surface and TOAB on PFO surface. The work function can be obtained from the UPS spectrum by taking the difference between the photon energy and the width spectrum, the latter being obtained from the energetic separation of $E_{cutoff}$ and the Fermi level. For PFO, $E_{cutoff}$ is located at 16.5 eV. The $E_{cutoff}$ of TOAB on PFO shifts toward higher binding energy (~0.5 eV) when compared with that of PFO. The shift of $E_{cutoff}$ may be due to the formation of an interfacial dipole pointing from the cathode to PFO, resulting from a redistribution of charges at the interface between PFO and TOAB. The interfacial dipole causes a shift in the vacuum level to reduce the electron-injection barrier between the high-work-function metals and the LUMO of PFO.

TEST EXAMPLE 2

The J-V-L measurements were performed to compare the performances of Examples 1-3 and Comparative Examples 1-3. Herein, a Keithley 2400 source measure unit and a Keithley 2000 digital multimeter with a silicon photodiode, calibrated using a Minolta LS-100 luminance meter, were used to carry out the J-V-L measurements. The photovoltaic measurement is performed under the illumination of a 150 W solar simulator (Thermo Oriel) at AM 1.5 G All measurements were performed in a $N_2$-filled glove box. The results are shown in FIGS. 5A and 5B.

Figure 5A:
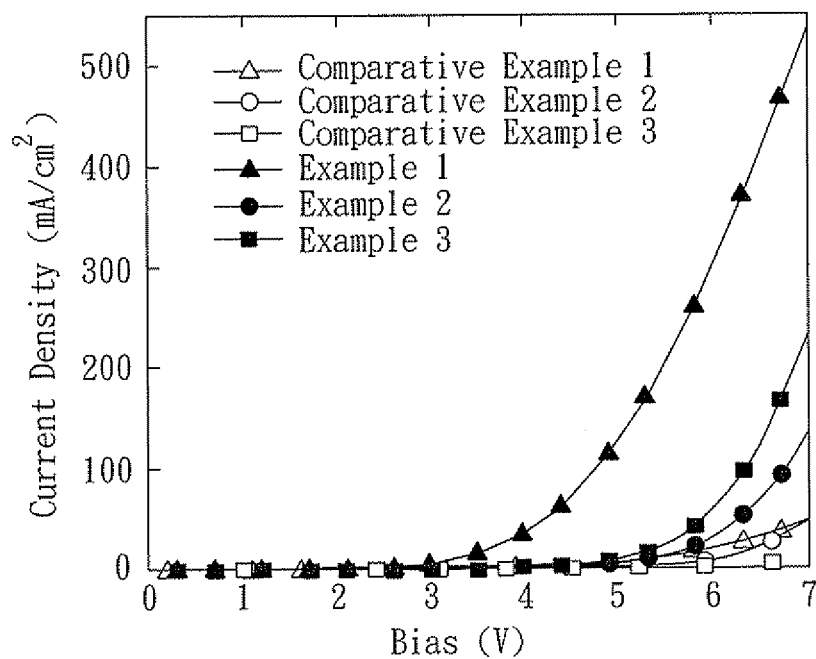
FIG. 5A shows a J-V diagram with respect to Examples 1-3 and Comparative Examples 1-3 of the present invention.

As shown in FIG. 5A, the devices according to Examples 1-3 exhibited larger current densities compared to those according to Comparative Examples 1-3 at the same bias. This result indicates that the presence of the electron injection layer containing the quaternary group VA salts can promote the injection of electrons no matter what the material of the cathode is (e.g. Al, Ag or Au).

Figure 5B:
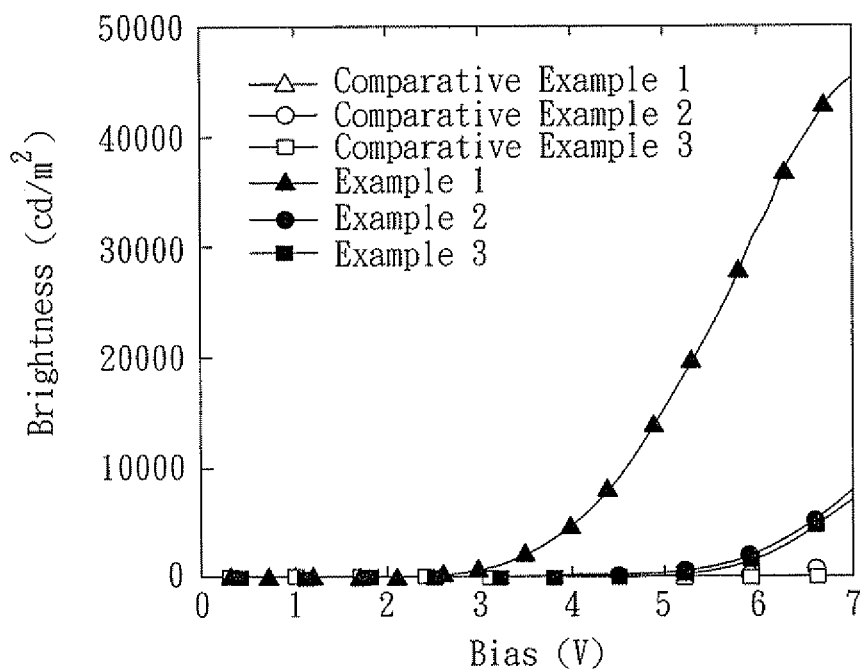
FIG. 5B shows an L-V diagram with respect to Examples 1-3 and Comparative Examples 1-3 of the present invention.

As shown in FIG. 5B, the devices according to Examples 1-3 performed significantly larger electroluminescence (EL) intensities compared to those according to Comparative Examples 1-3 at the same bias. In particular, the EL intensity of 7000 cd/$m^2$ at 7V was obtained from the device according to Example 3, whereas Comparative Example 3 was hardly detectable due to high work function of Au and no electron being injected. For the devices according to Examples 1 and 2, the EL intensities of 45000 cd/$m^2$ and 8000 cd/$m^2$ at 7V were respectively obtained. It is evident that the increase of injected electrons would enhance the recombination of electrons and holes in the organic active layer.

TEST EXAMPLE 3

The J-V-L measurements were performed in the same manner as those disclosed in Test example 2 to compare the performances of Example 7 and Comparative Example 1. The results are shown in FIGS. 6A and 6B.

Figure 6A:
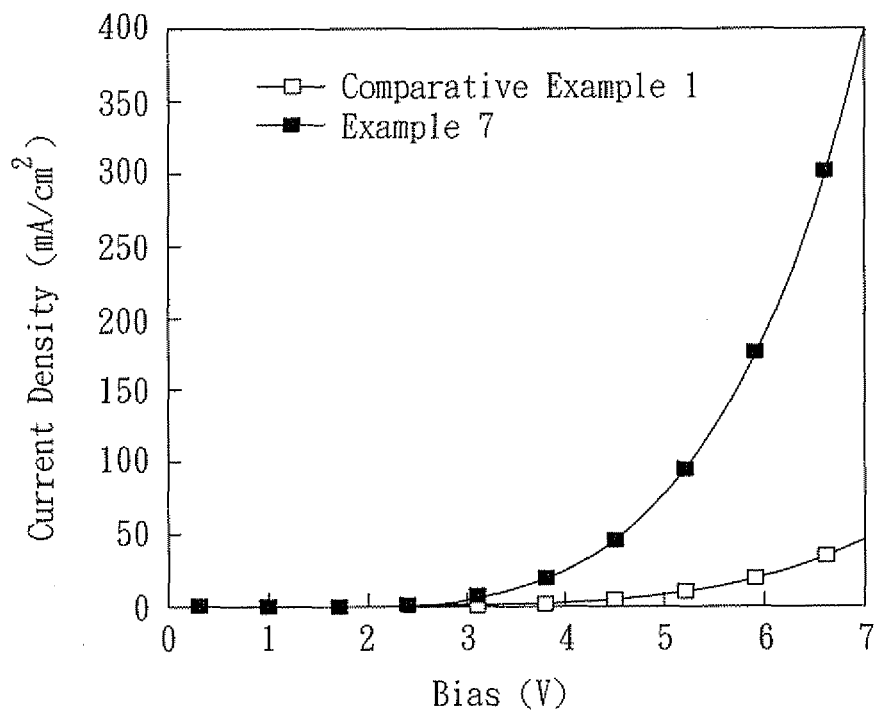
FIG. 6A shows a J-V diagram with respect to Example 7 and Comparative Example 1 of the present invention.
Figure 6B:
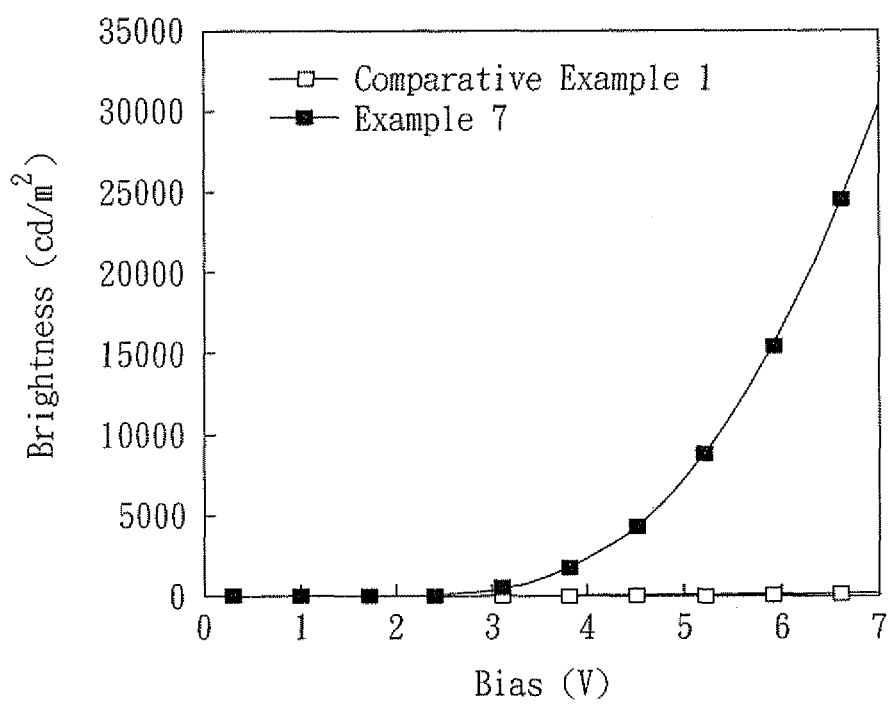
FIG. 6B shows an L-V diagram with respect to Example 7 and Comparative Example 1 of the present invention.

As shown in FIGS. 6A and 6B, the device according to Example 7 exhibited larger current density and higher EL intensity (~200 times) compared to that according to Comparative Example 1 at the same bias, owing to those reasons mentioned in Test Example 2. For the device according to Example 7, the EL intensity of 30000 cd/$m^2$ was obtained.

TEST EXAMPLE 4

The J-V-L measurements were performed in the same manner as those disclosed in Test example 2 to compare the performances of Examples 1, 8 and Comparative Example 4. The results are shown in FIGS. 7A and 7B.

Figure 7A:
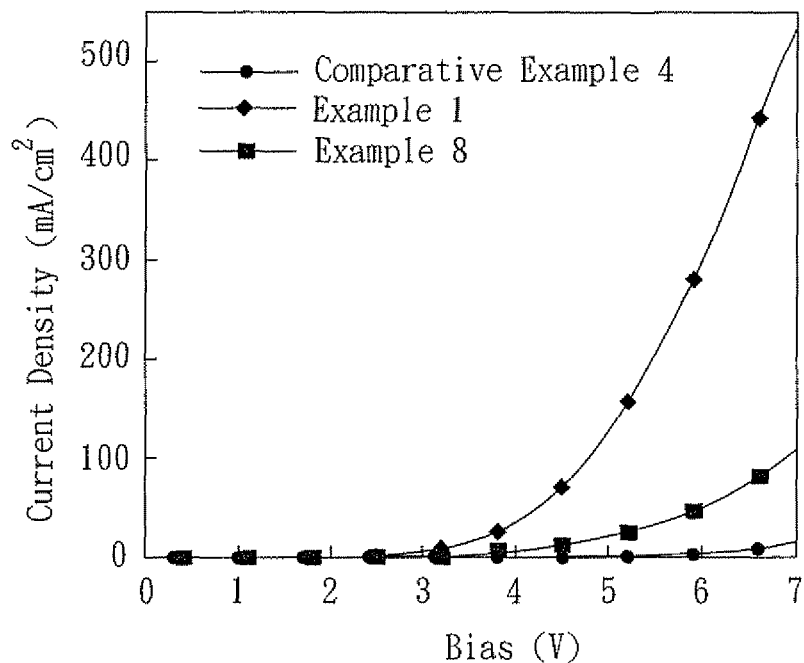
FIG. 7A shows a J-V diagram with respect to Examples 1 and 8 and Comparative Example 4 of the present invention.
Figure 7B:
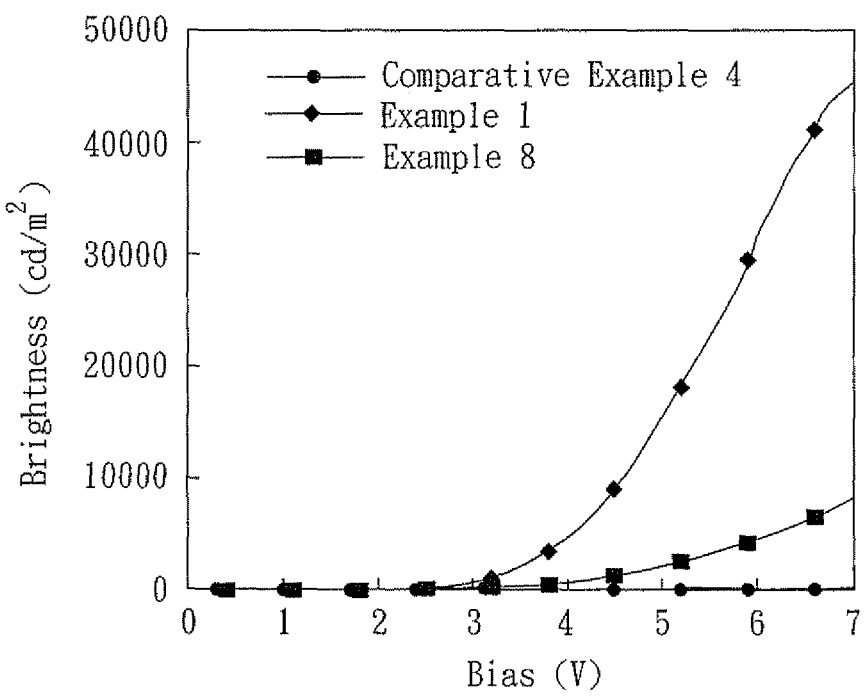
FIG. 7B shows an L-V diagram with respect to Examples 1 and 8 and Comparative Example 4 of the present invention.

As shown in FIGS. 7A and 7B, the devices according to Examples 1 and 8 exhibited larger current densities and higher EL intensities compared to that according to Comparative Example 4 at the same bias, owing to that the $Br^-$ in the alkyl chain pockets of TEAB or TOAB molecules nucleated on the PFO surface will be rejected away by the hydrophobic PFO surface to form an interfacial dipole pointing from the cathode to the organic active layer (i.e. PFO layer) and thereby to reduce the electron-injection barrier, resulting in the significant increase of injected electrons.

TEST EXAMPLE 5

The J-V-L measurements were performed in the same manner as those disclosed in Test example 2 to compare the performances of Examples 1, 9 and 10 and Comparative Example 1. The results are shown in FIGS. 8A and 8B.

Figure 8A:
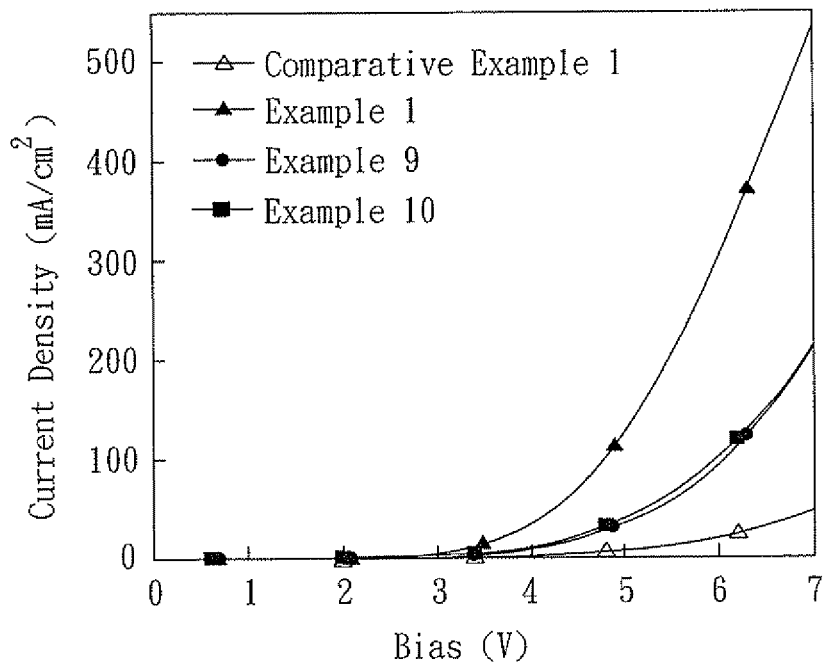
FIG. 8A shows a J-V diagram with respect to Examples 1 and 9-10 and Comparative Example 1 of the present invention.
Figure 8B:
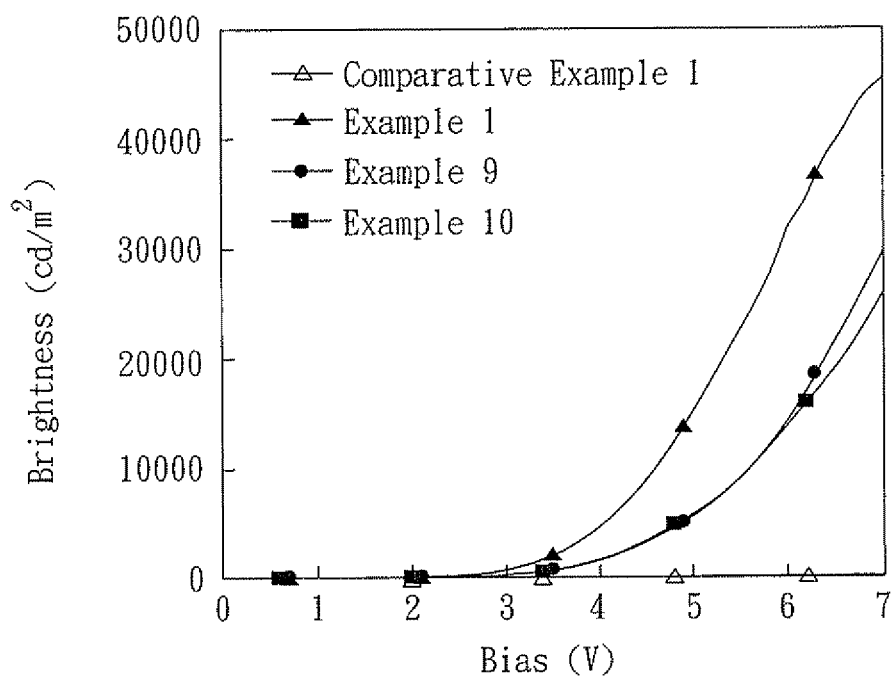
FIG. 8B shows an L-V diagram with respect to Examples 1 and 9-10 and Comparative Example 1 of the present invention.

As shown in FIGS. 8A and 8B, the devices according to Examples 1 and 9-10 exhibited better performance compared to that according to Comparative Example 1.

TEST EXAMPLE 6

The J-V-L measurements were performed in the same manner as those disclosed in Test example 2 to compare the performances of Examples 1 and 4-6 and Comparative Examples 1 and 4. The results are shown in FIGS. 9A and 9B.

Figure 9A:
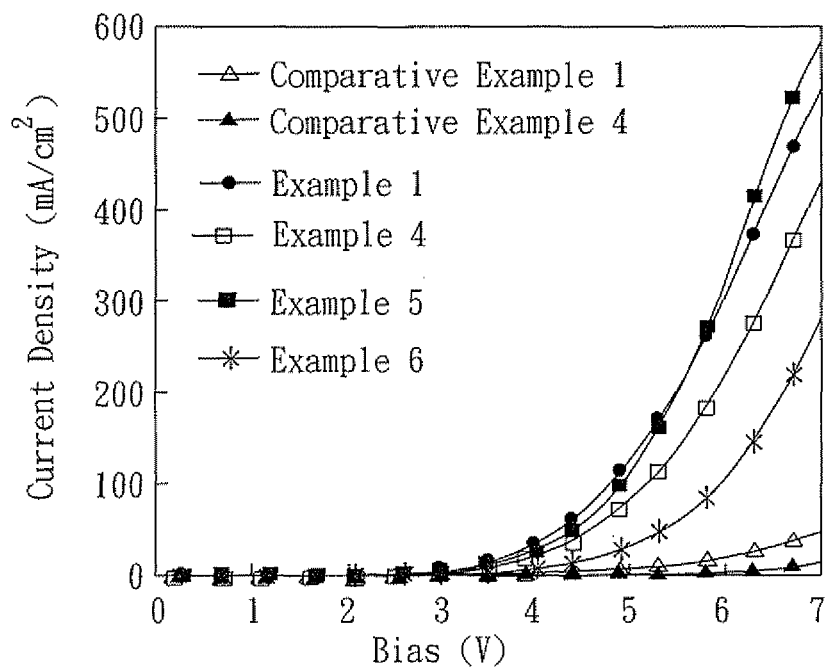
FIG. 9A shows a J-V diagram with respect to Examples 1 and 4-6 and Comparative Examples 1 and 4 of the present invention.
Figure 9B:
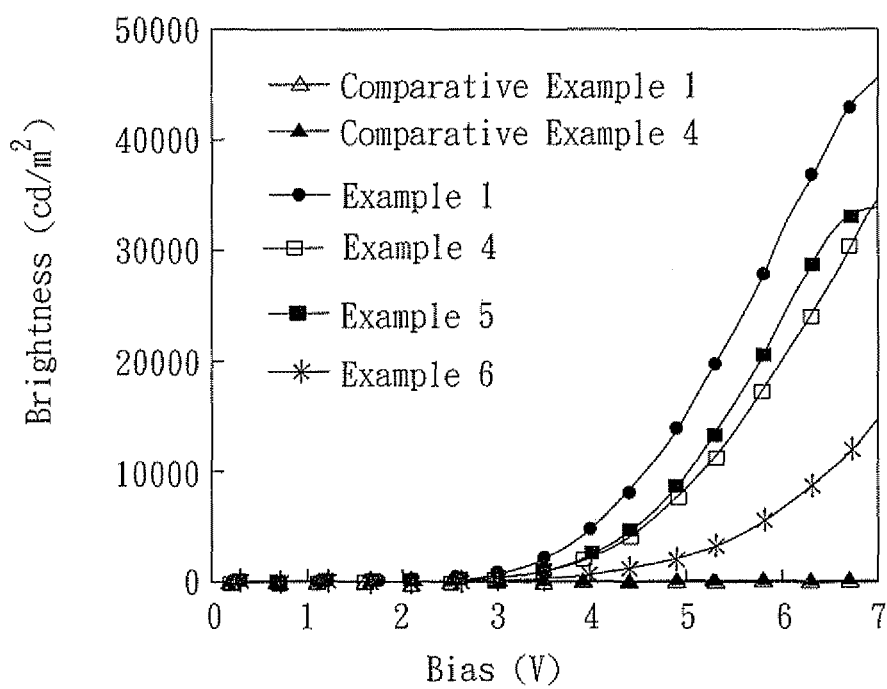
FIG. 9B shows an L-V diagram with respect to Examples 1 and 4-6 and Comparative Examples 1 and 4 of the present invention.

As shown in FIGS. 9A and 9B, the devices according to Examples 1 and 4-6 exhibited better performance compared to that according to Comparative Examples 1 and 4.

TEST EXAMPLE 7

The J-V-L measurements were performed in the same manner as those disclosed in Test example 2 to compare the performances of Examples 11-12 and Comparative Example 1. The results are shown in FIGS. 10A and 10B.

Figure 10A:
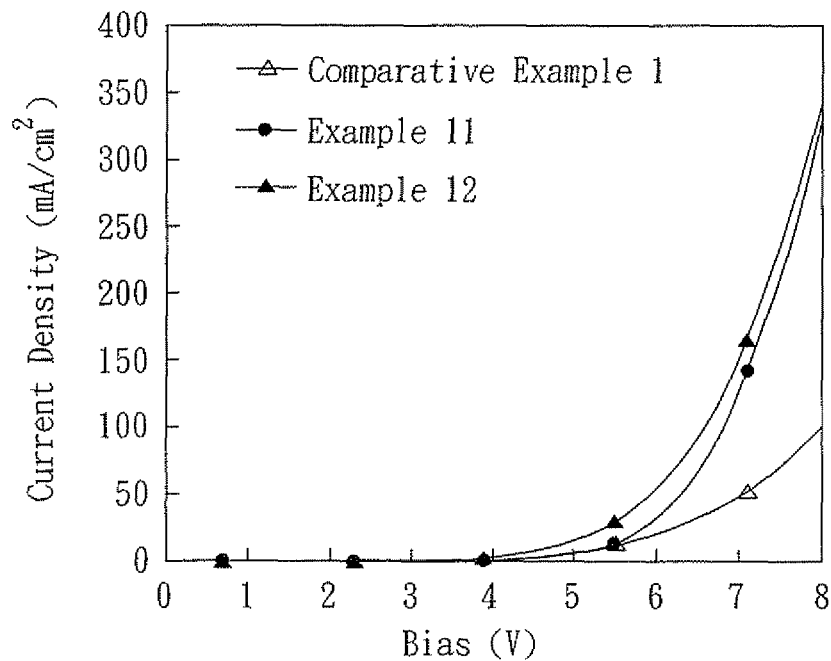
FIG. 10A shows a J-V diagram with respect to Examples 11-12 and Comparative Example 1 of the present invention.
Figure 10B:
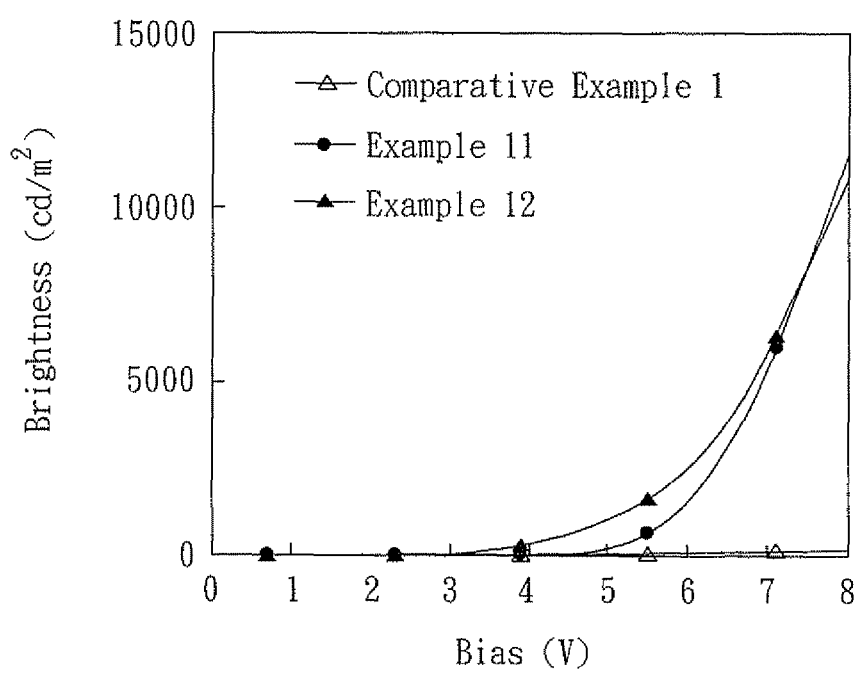
FIG. 10B shows an L-V diagram with respect to Examples 11-12 and Comparative Example 1 of the present invention.

As shown in FIGS. 10A and 10B, the devices according to Examples 11-12 exhibited better performance compared to that according to Comparative Example 1.

TEST EXAMPLE 8

The L-V measurements were performed in the same manner as those disclosed in Test example 2 to compare the performances of Example 13 and Comparative Example 5. The results are shown in FIG. 11.

Figure 11:
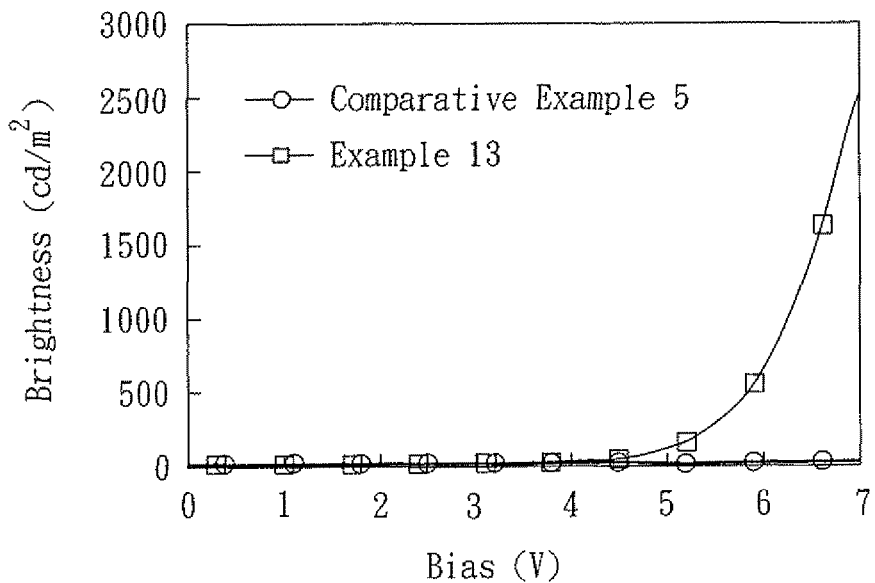
FIG. 11 shows a L-V diagram with respect to Example 13 and Comparative Example 5 of the present invention.

As shown in FIG. 11, no luminescence was observed from the device according to Comparative Example 5 under 7V because of the high injected barrier for electrons (~0.8 eV). However, the EL intensity for the device according to Example 13 was $2.51 \times 10^3$ cd/$m^2$ at 7 V. The improved device performance for the device according to Example 13 is mainly attributed to the decrease in the work function of the cathode, which is due to that the $Br^-$ in the alkyl chain pockets of TOAB molecules nucleated on the ZnO surface of the cathode will be attracted by the hydrophilic ZnO surface to form an interfacial dipole pointing from the cathode to the organic active layer.

TEST EXAMPLE 9

Figure 12:
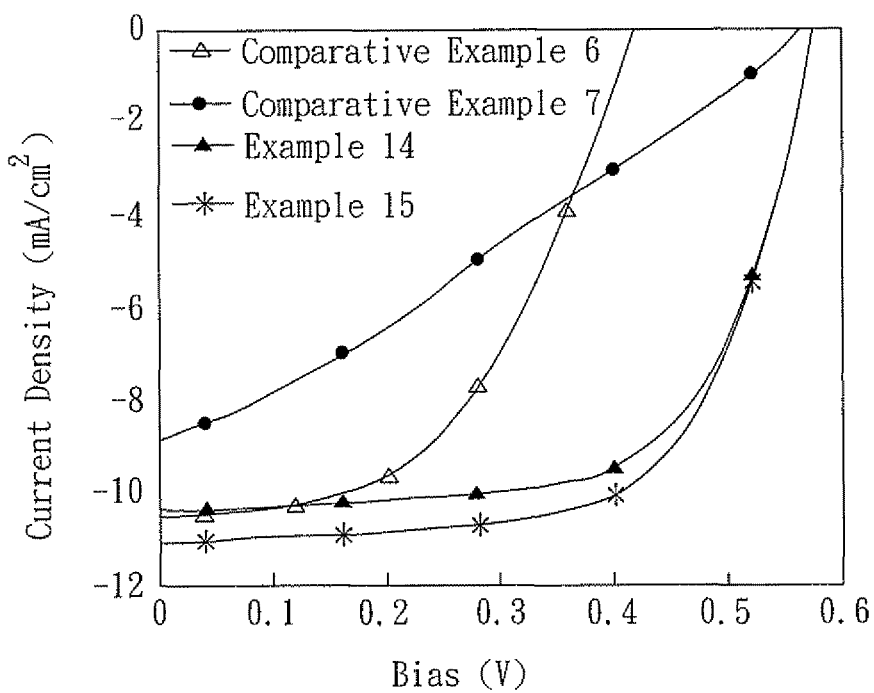
FIG. 12 shows a J-V diagram with respect to Examples 14-15 and Comparative Examples 6-7 of the present invention.

The performances of Examples 14-15 and Comparative Examples 6-7 were compared based on the current density-voltage (J-V) characteristics shown in FIG. 12, $V_{OC}$ (V), $J_{SC}$ (mA/$cm^2$), fill factor (FF, %), efficiency (%), parallel resistance ($R_P$, $\Omega cm^2$), series resistance ($R_S$, $\Omega cm^2$) shown in Table 1. Herein, the J-V characteristics were performed with a Keithley 2400 source-measure unit under simulated AM 1.5 G irradiation (100 mWcm$^{-2}$) using an Oriel 91660 A 300 W Solar Simulator in the glove box. The illumination intensity used was calibrated by a standard Si photodiode detector with a KG-5 color filter.

TABLE 1

|  | Comparative Example 6 | Comparative Example 7 | Example 14 | Example 15 |
|---|---|---|---|---|
| $V_{OC}$ (V) | 0.40 | 0.54 | 0.58 | 0.57 |
| $J_{SC}$ (mA/cm$^2$) | 10.44 | 8.42 | 10.33 | 11.06 |
| FF (%) | 0.48 | 0.28 | 0.63 | 0.63 |
| Efficiency (%) | 1.99 | 1.32 | 3.87 | 4.02 |
| $R_P$ (Ωcm$^2$) × 10$^4$ | 5.62 | 34.24 | 15.01 | 16.85 |
| $R_S$ (Ωcm$^2$) | 15.00 | 10.94 | 2.17 | 1.97 |

From the above results, it can be confirmed that the devices according to Examples 14-15 exhibited better performance compared to those according to Comparative Examples 6-7.

Although the present invention has been explained in relation to its preferred embodiment, it is to be understood that many other possible modifications and variations can be made without departing from the spirit and scope of the invention as hereinafter claimed.

What is claimed is:

1. An organic photoelectric semiconductor device, comprising:
   a first electrode;
   an organic active layer disposed over the first electrode;
   an organic salt-containing layer disposed over the organic active layer, wherein the organic salt-containing layer consists of quaternary group VA salts of cations represented by the following formula (I) or derivatives thereof and anions; and
   a second electrode, disposed over the organic salt-containing layer,

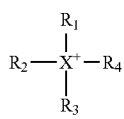
(I)

wherein X is N or P, and R$_1$, R$_2$, R$_3$ and R$_4$ each independently are C$_{1-20}$ alkyl, C$_{1-20}$ alkenyl or C$_{1-20}$ alkynyl.

2. The organic photoelectric semiconductor device as claimed in claim 1, further comprising: a hole injection layer or a hole collecting layer, disposed between the first electrode and the organic active layer.

3. The organic photoelectric semiconductor device as claimed in claim 1, wherein the organic salt-containing layer is used as an electron injection layer or an electron collecting layer.

4. The organic photoelectric semiconductor device as claimed in claim 3, wherein the organic salt-containing layer has a dipole moment pointing from the second electrode to the organic active layer.

5. The organic photoelectric semiconductor device as claimed in claim 1, wherein the first electrode or the second electrode is a metal electrode layer.

6. The organic photoelectric semiconductor device as claimed in claim 5, wherein the material of the metal electrode layer is aluminum, silver, gold, copper, iron or a combination thereof.

7. The organic photoelectric semiconductor device as claimed in claim 1, wherein R$_1$, R$_2$, R$_3$ and R$_4$ each independently are unsubstituted C$_{1-20}$ alkyl, unsubstituted C$_{1-20}$ alkenyl or unsubstituted C$_{1-20}$ alkynyl.

8. The organic photoelectric semiconductor device as claimed in claim 1, wherein the cations represented by the formula (I) are tetraoctylammonium cations, tetrabutylammonium cations, tetradodecylammonium cations, tetrahexadecylammonium cations, tetrabutylphosphonium cations, tetraethylammonium cations, methyltrioctylammonium cations, or trimethyloctylammonium cations.

9. The organic photoelectric semiconductor device as claimed in claim 1, wherein the anions are F$^-$, Cl$^-$, Br$^-$, I$^-$, BPh$_4^-$, BH$_4^-$, PF$_6^-$, SO$_4^{2-}$ or PO$_4^{3-}$.

10. The organic photoelectric semiconductor device as claimed in claim 1, wherein the organic photoelectric semiconductor device is an organic light-emitting diode, or an organic solar cell.

11. A method for manufacturing an organic photoelectric semiconductor device, comprising:
    (A) providing a first electrode;
    (B) forming an organic active layer over the first electrode;
    (C) forming an organic salt-containing layer disposed over the organic active layer, wherein the organic salt-containing layer consists of quaternary group VA salts of cations represented by the following formula (I) or derivatives thereof and anions; and
    (D) forming a second electrode over the organic salt-containing layer,

(I)

wherein X is N or P, and R$_1$, R$_2$, R$_3$ and R$_4$ each independently are C$_{1-20}$ alkyl, C$_{1-20}$ alkenyl or C$_{1-20}$ alkynyl.

12. The method as claimed in claim 11, further comprising a step (A1) between the step (A) and the step (B): forming a hole injection layer or a hole collecting layer over the first electrode, and the organic active layer is formed over the hole injection layer or the hole collecting layer.

13. The method as claimed in claim 11, wherein the organic salt-containing layer is used as an electron injection layer or an electron collecting layer.

14. The method as claimed in claim 11, wherein the organic salt-containing layer is formed by a solution fabrication process or a dry process.

15. The method as claimed in claim 11, wherein R$_1$, R$_2$, R$_3$ and R$_4$ each independently are unsubstituted C$_{1-20}$ alkyl, unsubstituted C$_{1-20}$ alkenyl or unsubstituted C$_{1-20}$ alkynyl.

16. A method for manufacturing an organic photoelectric semiconductor device, comprising:
    (A) providing a second electrode;
    (B) forming an organic salt-containing layer disposed over the second electrode, wherein the organic salt-containing layer consists of quaternary group VA salts of cations represented by the following formula (I) or derivatives thereof and anions;
    (C) forming an organic active layer over the organic salt-containing layer; and
    (D) forming a first electrode over the organic active layer,

(I)

wherein X is N or P, and R$_1$, R$_2$, R$_3$ and R$_4$ each independently are C$_{1-20}$ alkyl, C$_{1-20}$ alkenyl or C$_{1-20}$ alkynyl.

17. The method as claimed in claim 16, further comprising a step (C1) between the step (C) and the step (D): forming a hole injection layer or a hole collecting layer over the organic active layer, and the first electrode is formed over the hole injection layer or the hole collecting layer.

18. The method as claimed in claim 16, wherein the organic salt-containing layer is used as an electron injection layer or an electron collecting layer.

19. The method as claimed in claim 16, wherein the organic salt-containing layer is formed by a solution fabrication process or a dry process.

20. The method as claimed in claim 16, wherein $R_1$, $R_2$, $R_3$ and $R_4$ each independently are unsubstituted $C_{1-20}$ alkyl, unsubstituted $C_{1-20}$ alkenyl or unsubstituted $C_{1-20}$ alkynyl.

\* \* \* \* \*